United States Patent [19]

Sekine et al.

[11] Patent Number: 5,013,629
[45] Date of Patent: May 7, 1991

[54] COLOR IMAGE RECORDING MATERIAL

[75] Inventors: Mikiya Sekine, Warabi; Shigetoshi Hiraishi, Tokyo, both of Japan

[73] Assignee: Mitsubishi Paper Mills Limited, Tokyo, Japan

[21] Appl. No.: 385,498

[22] Filed: Jul. 26, 1989

[30] Foreign Application Priority Data

May 9, 1989 [JP] Japan .................................. 1-115600

[51] Int. Cl.$^5$ ................................................ G03C 1/72
[52] U.S. Cl. ..................................... 430/138; 430/220
[58] Field of Search ................................ 430/138, 220

[56] References Cited

U.S. PATENT DOCUMENTS 4,440,846  4/1984  Sanders et al. ...................... 430/138
4,780,391 10/1988  Hiraishi et al. ..................... 430/138

FOREIGN PATENT DOCUMENTS 59-30537   2/1984  Japan .
61-275742 12/1986  Japan .
62-39845   2/1987  Japan .
62-398844  2/1987  Japan .
62-187836  8/1987  Japan .

Primary Examiner—Charles L. Bowers, Jr.
Assistant Examiner—Janet C. Baxter
Attorney, Agent, or Firm—Cushman, Darby & Cushman

[57] ABSTRACT

A color image recording material which can afford full color images superior in resolution and shelf stability is provided by forming a whitening layer having a specific property and an image receiving layer and, if necessary, a transparent film layer in succession on a photosensitive layer.

8 Claims, No Drawings

COLOR IMAGE RECORDING MATERIAL

BACKGROUND OF THE INVENTION

1. Field of the Invention

The present invention relates to a color image recording material of mono-sheet type which forms full color images of excellent shelf stability and high resolution utilizing photo-curable microcapsules.

2. Related Art Statement

Recording materials which form color images using photo-curable microcapsules are disclosed, for example, Japanese Patent Kokai (Laid-Open) Nos. 59-30537 (U.S. Ser. No. 339917), 61-275742, 62-187836, 62-39844 and 62-39845.

As one of the embodiments disclosed in Japanese Patent Kokai (Laid-Open) No. 59-30537 (U.S. Ser. No. 339917) there is a process of forming images by transferring a color precursor from a transfer sheet comprising a support and, provided thereon, microcapsules containing color precursors of cyan, magenta and yellow and a photosensitive resin to an image receiving sheet having a layer of a developing material. Another embodiment disclosed in the above patent publication is use of a transfer sheet comprising a support and, provided thereon, microcapsules containing color precursors of cyan, magenta and yellow and a photosensitive composition different in sensitive wavelength. The exposed microcapsules-coated side of the transfer sheet and the developing material-coated side of the image receiving sheet are brought into close contact with each other and applied with pressure to transfer the color precursor, whereby a complete color image can be obtained by one pressure transfer. Alternatively, the so-called "self-contained" technique can be used in connection with the above-mentioned embodiment. For example, under a layer of photosensitive microcapsules containing a color pressor a layer of a developing material is provided as another layer and an image can be formed on a support by a self type image formation. However, the color precursors used in the above patent publication are colorless electron donor type leuco dyes and are inferior in image shelf stability such as light resistance, fingerprinting resistance and solvent resistance. In the case of the process of forming images by transfer to image receiving sheet, the transfer sheet becomes useless after recording and this requires maintenance for disposal of the waste transfer sheet and further this process is not economical. Moreover, according to the first embodiment of the above patent publication, exposures must be done three times for respective cyan, magenta and yellow and accordingly transfer must be carried out three times and hence color images of high resolution are difficult to obtain owing to the problem of deviation in the position of images. Further, in the case of self type, when sensitivity to visible light region is imparted, background is colored. Therefore, only photosensitive composition sensitive to ultraviolet region can be used to keep the background in white color.

The recording material disclosed in Japanese Patent Kokai (Laid-Open) No. 61-275742 is characterized in that it has at least a photosensitive silver halide, a reducing agent, a polymerizable compound and a color image forming substance on a support and at least the polymerizable compound and the color image forming substance are enclosed in the same microcapsule. This process has the advantages that the material can have a sensitivity to visible light and besides has high sensitivity because photosensitive silver halide is used, but has the defect that it is expensive.

The recording material disclosed in Japanese Patent Kokai (Laid-Open) No. 62-187836 filed by the present inventors is a color image recording material which comprises a support and, provided thereon, multilayers comprising at least two of (a) a layer of microcapsules containing mainly a photo-curable resin or microcapsules containing mainly a photo-curable resin and a coloring agent, (b) a layer of a light proofing white material and (c) a layer mainly composed of a coloring agent, said lightproofing white layer mainly composed of lightproofing white material being provided directly or indirectly on a picture element layer comprising picture elements of two or more colors comprising microcapsules containing mainly a photo-curable resin and a coloring agent or coloring agents arranged in the form of stripe or mosaic. One embodiment of the invention disclosed in the patent publication includes a color image recording material which comprises a support on which is provided a picture element layer comprising picture elements of at least two colors comprising coloring agents arranged in the form of stripe or mosaic, on which are further provided a layer of microcapsules containing mainly a photo-curable resin and a lightproof white layer comprising a lightproof white material in succession. In this image recording material, colored dye or pigment which has been used for printing ink can be utilized and so the resulting image is very high in shelf stability, but in order to obtain a color image of high resolution, the size of the picture elements arranged in the form of stripe or mosaic must be smaller than 1/10 (mm/dot), preferably 1/20 (mm/dot) and this is difficult by ordinary printing technique. Furthermore, in this process, positions of the picture elements of cyan, magenta and yellow must be read also at the time of recording and with reduction of the size of the picture elements this reading becomes difficult.

The recording material disclosed in Japanese Patent Kokai (Laid-Open) Nos. 62-39844 and 62-39845 is a plain paper transfer type photosensitive and pressure-sensitive recording sheet which comprises combination of a plain paper with a coated paper comprising a support coated with microcapsules containing a photo-curable resin and a solution of colored dye or pigment dissolved or dispersed in an organic solvent. However, this is also operationally and economically not preferred in that a transfer sheet is used.

SUMMARY OF THE INVENTION

The object of the present invention is to provide a recording material by which a full color image excellent in resolution and good in shelf stability can be obtained inexpensively and by simple procedure.

It has been found that the above object can be attained by using a color recording material which comprises a transparent or translucent support and, provided thereon in succession, a photosensitive layer comprising irregularly arranged three kinds of photocurable microcapsules which respectively contain any one of yellow, magenta or cyan dye or pigment and a photosensitive resin and which are sensitive to lights of different wavelengths, respectively, a whitening layer and an image receiving layer. The present invention is based on this finding. A gloss color image can be obtained by further providing a transparent film layer on the image receiving layer.

DETAILED DESCRIPTION OF PREFERRED EMBODIMENTS

The photosensitive layer of the color image recording material of the present invention comprises colored photo-curable microcapsules which contain a dye or a pigment of yellow, magenta or cyan and hence has greyish black color. Therefore, it is necessary to hide the color of the photosensitive layer when color images are formed on the image receiving layer not so as to cause coloration of background. Coloration of background can be prevented merely by providing a whitening layer on the photosensitive layer, but there is still the problem that the resulting color images are inferior in brightness of color and quality of the image is unsatisfactory. On the other hand, when the image receiving layer alone is provided, coloration of background cannot completely be prevented and when thickness of the image receiving layer is increased for complete prevention, color image density decreases, resulting in deterioration of image quality. It has been found that color images of good quality can be obtained by using in combination an image receiving layer and a whitening layer comprising a white pigment having a specific property. Thus, the present invention has been accomplished.

The white pigment used for the whitening layer is required to have a great hiding power and, for this purpose, it must have a high refractive index. The refractive index should be 1.7 or higher, preferably 2.0 or higher.

White pigments having such refractive index include, for example, titanium oxide (refractive index: 2.55-2.70), zinc oxide (2.01), zinc sulfide (2.38), magnesium oxide (1.74) and aluminum oxide (1.76). Naturally, the present invention should not be limited to these pigments and there may be used any of those which have a refractive index of 1.7 or higher. Moreover, these pigments may be used alone or in combination. If a pigment having a refractive index of lower than 1.7 is used, the colored photosensitive layer cannot be sufficiently hidden and the whitening layer must be thick. As a result, most of the photosensitive resin and dye or pigment released by rupture of photo-curable microcapsules are retained in the whitening layer and sufficient amount of them do not migrate to the image receiving layer to cause extreme reduction in density of the resulting color image.

Thickness of the whitening layer is preferably 0.1-5 μm, especially 0.5-3 μm. If it is less than 0.1 μm, hiding ability is insufficient and whiteness is insufficient and if it is more than 5 μm, density and brightness of the resulting color images are inferior.

For formation of the whitening layer, it is preferred to coat the white pigment together with a binder and water-soluble polymers or latexes are generally used as the binder. As the binder, mention may be made of water-soluble polymers and latexes such as gelatin, casein, carboxymethylcellulose, hydroxymethylcellulose, oxidized starches, esterified starches, polyvinyl alcohol, polyvinylpyrrolidone, polyacrylic acid, vinyl acetate-acrylic acid copolymer, acrylonitrile - butadiene copolymer and vinylidene chloride copolymers. These are selected in view of film surface strength and dispersibility and are used alone or in combination.

The whitening layer can be formed, for example, by coating the white pigment on the whole surface of the support by air knife coater, blade coater or gravure coater or on a part of the support by flexographic printer or gravure printer.

In the color image recording material of the present invention, photo-curable capsules in unexposed area (uncured microcapsules) are ruptured upon application of pressure and/or heat and the released dye or pigment and photosensitive resin pass through the whitening layer and penetrate into the image receiving layer to be recognized as an image. Therefore, refractive index of the pigment constituting the image receiving layer greatly affect color brightness, color shade and density of the image.

Especially, when the image receiving layer comprises a pigment having a refractive index of 1.4-1.6, images of higher coloration density and chroma can be obtained. This is because the refractive index of the pigment is close to the refractive index (about 1.4-1.5) of photosensitive resin referred to hereinafter and so when the photosensitive resin penetrates into the image receiving layer, transparency of the image receiving layer increases and as a result a clear and bright images can be obtained.

Ordinarily, any of the pigments having a refractive index of 1.4-1.6 can be used and preferred are inorganic pigments such as silica (refractive index: 1.43-1.48), diatomaceous earth (1.46), kaolin (1.56), and satin white (1.48) and organic pigments such as polystyrene (1.59) and polyethylene (1.52-1.55). These may be used alone or in combination.

If refractive index of the pigment constituting the image receiving layer is less than 1.4 or more than 1.6, density and brightness of the resulting image decrease and this is not preferred.

Thickness of the image receiving layer is preferably 3-30 μm, especially 5-20 μm. If the thickness is less than 3 μm, the image receiving layer cannot sufficiently absorb the photosensitive resin and the dye or pigment released upon rupture of photo-curable microcapsules and if it is more than 30 μm, the image receiving layer is too thick and sufficient image density cannot be obtained.

In case of coating the image receiving layer, binders such as water-soluble polymers or latexes can also be used as in the formation of the whitening layer.

The image receiving layer can also be coated by the same methods as employed for coating of the whitening layer.

It is also possible to provide a transparent film layer on the image receiving layer to impart gloss to the resulting image. Means for providing such film layer include coating of a polymer solution of high film-formability such as polyvinyl alcohol or styrene-butadiene latex, lamination of a thermoplastic polymer material such as polyethylene, polypropylene or poly(ethylene-vinyl acetate) and lamination of a polypropylene film or a polyester film by adhesive-bonding.

Lights of three different wavelengths to which the photo-curable microcapsules containing yellow, magenta or cyan dye or pigment are sensitive are preferably blue, green and red lights, respectively, but these are not limitative. Any wavelengths can be employed as far as spectral sensitivity curves of microcapsules of yellow, magenta and cyan are completely separated. That is, they can be chosen so that lights which cure yellow, magenta and cyan microcapsules give no influence on magenta and cyan microcapsules, yellow and cyan microcapsules and yellow and magenta microcapsules, respectively.

In addition, to the photosensitive resin and the dyes or pigments contained in photo-curable microcapsules which are sensitive to the lights of such three different wavelengths, a photoinitiator must be contained for curing the photosensitive resin. Examples of the photoinitiator are aromatic ketones, quinone compounds, thioxanthone compounds, ketocoumarin compounds, halides, biimidazole compounds and organic peroxides. Generally, these photoinitiators are sensitive to light of 300–450 nm. As specific examples of the photoinitiators, mention may be made of acetophenone, benzophenone, Michler's ketone, benzyl, benzoin, benzoinisobutyl ether, benzyldimethyl ketal, 1-hydroxycyclohexylphenyl ketone, α-hydroxyisobutylphenone, p-isopropyl-α-hydroxyisobutylphenone, 2,2-dimethoxy-2-phenylacetophenone, p-tert-butyltrichloro -acetophenone, p-tert-butyldichloroacetophenone, αα-dichloro-4-phenoxyacetophenone, fluorenone, xanthone, dibenzosuberone, anthraquinone, 2-ethylanthraquinone, 1,5-dichloroanthraquinone, 9,10-phenanthrenequinone, benzanthrone, 2-chlorothioxanthone, 2,4-diethyl -thioxanthone, 3,3'-carbonylbis(7-diethylaminocoumarin), 7-diethylamino-3-cinnamoylcoumarin, 7-diethylamino -3-(4-dimethylaminocinnamoyl)coumarin, chloromethylxanthone, chloromethylthioxanthone, chloromethylnaphthalene, chloromethylanthracene, chloromethylquinoline, 2,4,6-tris -trichloromethyl-s-triazine, 2-methyl-4,6-bis(trichloro- methyl)-s-triazine, 2,2'-bis(o-chlorophenyl)-4,4',5,5'-tetraphenylimidazole, 2,2'-bis(o-methoxyphenyl)-4,4', 5,5'-tetraphenylbiimidazole, 2,2'-bis(o-chlorophenyl)-4,4',5,5'-tetra (m-methoxyphenyl)-biimidazole, 3,3',4,4'-tetra -(tert-butylperoxycarbonyl)-benzophenone, di(tert-butylperoxy)phthalate, di(tert-butylperoxy) isophthalate and di(tert-butylperoxy) tetraphthalate. When counter ion compounds of cyanine or merocyanine compounds are used, sensitivity to further longer wavelength can be obtained. These photoinitiators are added in an amount of about 0.1–15% by weight of photosensitive resin. In addition to these photoinitiators, there may be further added known sensitizers, chain transfer agents, spectral sensitizing dyes, thermal polymerization initiators and thermal polymerization inhibitors.

The photosensitive resins contained in the photo-curable microcapsules used in the present invention include monomers or oligomers containing at least one, preferably at least two vinyl or vinylidene groups such as compounds containing acryloyl group, methacryloyl group, allyl group, acrylamide group, or vinyl ether group. Examples there of are 2-ethylhexyl acrylate, 2-hydroxyethyl acrylate, 2-hydroxypropyl acrylate, 2-hydroxyethylacryloyl phosphate, 1,3-butanediol acrylate, 1,4-butanediol diacrylate, 1,6-hexanediol diacrylate, diethylene glycol diacrylate, tripropylene glycol diacrylate, neopentyl glycol diacrylate, polyethylene glycol (400) diacrylate, hydroxypivalic ester neopentyl glycol diacrylate, trimethylolpropane triacrylate, pentaerythritol triacrylate, and dipentaerythritol hexaacrylate. The oligomers include polyester acrylate, epoxy acrylate, polyurethane acrylate, polyether acrylate, oligo acrylate and alkyd acrylate.

The yellow, magenta and cyan dyes or pigments may be either dyes or pigments as far as they are balanced in color, but coloring agents which give good image shelf stability are preferred. Examples of yellow pigments are chrome yellow, zinc yellow, barium chromate, cadmium yellow, yellow oxide, yellow ochre, titanium yellow, lead cyanamide, calcium plumbate, Naphthol Yellow S, Hansa Yellow 10G, Hansa Yellow 5G, Hansa Yellow 3G, Hansa Yellow G, Hansa Yellow GR, Hansa Yellow A, Hansa Yellow RN, Hansa Yellow R, Pigment Yellow L, Benzidine Yellow, Benzidine Yellow G, Benzidine Yellow GR, Permanent Yellow NCG, Vulcan Fast Yellow 5G, Vulcan Fast Yellow R, Tartrazine Lake, Quinoline Yellow Lake, Anthracene Yellow 6GL, Permanent Yellow FGL, Permanent Yellow H10G, Permanent Yellow HR, and Anthrapyrimidine Yellow. Examples of magenta pigments are iron oxide red, red lead, silver red, cadmium red, cadmium mercury red, antimony red, Permanent Red 4R, Para Red, Fire Red, p-chloro-o-nitroaniline red, Lithol Fast Scarlet G, Brilliant Fast Scarlet, Brilliant Carmine BS, Permanent Red F2R, Permanent Red F4R, Permanent Red FRL, Permanent Red FRLL, Permanent Red F4RH, Fast Scarlet VD, Vulcan Fast Rubine B, Vulcan Fast Pink G, Light Fast Red Toner B, Light Fast Red Toner R, Permanent FB, Pyrazolone Red, Lithol Red, Lake Red C, Lake Red D, Anthosine B, Brilliant Scarlet G, Lithol Rubine GK, Permanent Red F5R, Brilliant Carmine 6B, Pigment Scarlet 3B, Bordeaux 5B, Toluidine Maroon, Permanent Bordeaux F2R, Helio Bordeaux BL, Bordeaux 10B, Bon Maroon Light, Bon Maroon Medium, Eosine Lake, Rhodamine Lake B, Rhodamine Lake Y, Alizarine Lake, Thioindigo B, Thioindigo maroon, Permanent Red FGR, PV Carmine HR, Monolight Fast Red YS, and Permanent Red BL. Examples of cyan pigments are ultramarine, Prussian blue, cobalt blue, cerulean blue, asbolite, Alkali Blue Lake, Peacock Blue Lake, Victoria Blue lake, metal-free phthalocyanine blue, phthalocyanine blue, Fast Sky Blue, Indanthrene Blue RS, Indanthrene Blue BC, and indigo.

The dyes are selected from colored dyes such as those of monoazo type, bisazo type, metal complex monoazo type, anthraquinone type, phthalocyanine type, and triallyl methane type. Examples of these dyes shown by color index number are as follows. Yellow: 11020, 11021, 12055, 12700, 18690, 18820, and 47000; Magenta: 12010, 12150, 12715, 26105, 26125, 27291, 45170B, and 60505; and Cyan: 61100, 61705, 61525, 62100, 42563B, and 74350.

The dye and pigment used in the present invention as coloring agent are required to be at least three colors of yellow, magenta and cyan, but may be four colors of these three colors and black. However, for photo-curable microcapsules containing a black dye or pigment, a photoinitiator system having a fourth sensitive wavelength to which the yellow, magenta and cyan photocurable microcapsules are not sensitive must be used. The black pigments include carbon black, acetylene black, lamp black, bone black, graphite, iron black, mineral black, aniline black, and cyanine black. The black dyes include 12195, 26150, and 50415 in color index number.

The microcapsules used in the present invention can be prepared by common methods such as, for example, phase separation from aqueous solution as disclosed in U.S. Pat. Nos. 2800457 and 2800458; interfacial polymerization as disclosed in Japanese Patent Kokoku (Publication) Nos. 38-19574, 42-446 and 42-771; in-situ method by polymerization of monomers as disclosed in Japanese Patent Kokoku (Publication) No. 36-9168 and Japanese Patent Kokai (Laid-Open) No. 51-9079; melt dispersion cooling method as disclosed in British Patent Nos. 952807 and 965074, and spray drying method as disclosed in U.S. Pat. No. 3111407 and British Patent No. 930422. However, the present invention is not limited to use of these methods.

As wall-forming materials, there may be used gelatin, gum arabic, starch, sodium alginate, ethylcellulose, carboxyethylcellulose, polyvinyl alcohol, polyethylene, polyamide, polyester, polyurethane, and polyethyleneimine and preferred are those which are smaller in permeability constant for oxygen which is a polymerization inhibitor.

Size of the photo-curable microcapsules can be freely controlled at the time of preparation thereof and finer ones are preferred because quality of the resulting color image is affected by the size. Average particle size of the capsules is 1–50 μm, preferably 2–20 μm.

A capsule protective agents such as cellulose powders, starch particles and plastic particles may be added to the photosensitive layer comprising the photo-curable microcapsules.

These materials are coated together with the aforementioned binders such as water-soluble polymers and latexes to form the photosensitive layer.

The photosensitive layer can be provided in the same manner as for coating the whitening layer mentioned hereinbefore.

The color image recording material of the present invention is imagewise exposed from the side of support. Therefore, the support must be transparent or translucent to the exposure light, namely, to the light which cures the photo-curable microcapsules. The lights which cure the photo-curable microcapsules are lights of three or four wavelengths selected from ultraviolet region, visible region and infrared region. As the support which is transparent or translucent to these lights, there may be used plastic films such as polyester, polypropylene, polyethylene and cellulose triacetate, transparent papers such as cellophane, tracing paper and capacitor paper, synthetic papers, and composite papers of them.

As light source, there may be used sunlight or light from xenon lamp, low-pressure or high-pressure mercury lamp and tungsten lamp which are converted into monochromatic light depending on the wavelength to which the photo-curable microcapsules are sensitive. Furthermore, laser may also be used if it conforms to the wavelength to which the photo-curable microcapsules are sensitive.

The photo-curable microcapsules used in the present invention are those which contain mainly a dye or a pigment, a photosensitive resin and a photoinitiator and have the following characteristics. Generally, microcapsules are prepared by encapsulating a liquid or solid material as a core material thereby to isolate the core material from other material in the ordinary state and when it becomes necessary, the microcapsules are ruptured by application of external pressure and/or heat to release the core material, which is allowed to react with other material or mixed with other material.

Therefore, if pressure and/or heat are applied to a support coated with microcapsules, all of the microcapsules of that area are necessarily ruptured and the core material is unavoidably released. On the other hand, in the case of photo-curable microcapsules, rupture caused by application of pressure and/or heat is controlled by light. That s, when release of the core material is desired, pressure and/or heat are externally applied to rupture the microcapsules and release the core material as in the ordinary microcapsules. However, in case it is desired to keep the core material as it is in the microcapsules, when the microcapsules are exposed to light, the light transmitting through wall of the microcapsules cures the photosensitive resin which is a part of the core material to change the core material from a liquid or soft resin to a rigid resin. As a result, the microcapsules become rigid capsules and are no longer ruptured upon application of external pressure and/or heat and the core material is not released.

The photo-curable microcapsules containing yellow, magenta or cyan dye or pigment contain photoinitiators sensitive to the lights of different three wavelengths, respectively. For example, if photo-curable microcapsules containing yellow, magenta and cyan dye or pigment respectively contain photoinitiators sensitive to the light of wavelengths $\lambda_1$, $\lambda_2$, and $\lambda_3$, formation of colors of yellow, magenta, cyan, red, green, blue and white can be attained by irradiation of the lights of $\lambda_2$ and $\lambda_3$; $\lambda_1$ and $\lambda_3$; $\lambda_1$ and $\lambda_2$; $\lambda_3$; $\lambda_2$; $\lambda_1$; and $\lambda_1$, $\lambda_2$ and $\lambda_3$, respectively. Black can be formed by irradiation of no light. $\lambda_1$, $\lambda_2$, and $\lambda_3$ are preferably lights of blue, green and red, respectively, but these are not limitative.

The whitening layer according to the present invention hides the colored photosensitive layer comprising photo-curable microcapsules containing mainly yellow, magenta or cyan dye or pigment and a photosensitive resin and keeps the background white.

Furthermore, the image receiving layer according to the present invention comprises a pigment having a refractive index nearly equal to that of the photosensitive resin and hence can markedly improve density and brightness of the resulting images.

The transparent or translucent support used in the present invention not only supports the photosensitive layer, the whitening layer and the image receiving layer, but also efficiently transmitts the light which cures the microcapsules.

The following examples will further explain the present invention. The part and percent used in the examples are by weight.

EXAMPLE 1

(1) Preparation of photo-curable microcapsules containing a cyan pigment 100 parts of a 10% aqueous solution of ethylene-maleic anhydride copolymer, 10 parts of urea, 1 part of resorcin and 200 parts of water were mixed to obtain a solution. This solution was adjusted to a pH of 3.5 with aqueous sodium hydroxide solution.

Separately, 6 parts of phthalocyanine blue was sufficiently homogeneously dispersed in 100 parts of trimethylolpropane triacrylate by a sand grinder. Then, in this dispersion was dissolved 2 parts of 1-hydroxy-cyclohexylphenyl ketone (Irgacure 184, $\lambda$max 330 nm, manufactured by Ciba-Geigy Corp.). The resulting solution was emulsified and dispersed in the above aqueous solution to obtain an O/W type emulsion of 4–8 μm in oil-drop size. Then, 2.5 parts of 37% aqueous formaldehyde solution was added thereto, followed by stirring for 4 hours with keeping the emulsion at 55° C. and thereafter cooling to room temperature to complete encapsulation.

(2) Preparation of photo-curable microcapsules containing a magenta pigment

Microcapsules were prepared in the same manner as in the above (1) except that 8 parts of Permanent Carmine FB was used as a magenta pigment in place of the cyan pigment and 2 parts of 2-chlorothioxanthone (CTX, λmax=380 nm, manufactured by Nihon Kayaku Co.) and 2 parts of ethyl N,N-dimethylaminobenzoate were used as photoinitiators in place of 1-hydroxycyclohexylphenyl ketone.

(3 Preparation of photo-curable microcapsules containing a yellow pigment

Microcapsules were prepared in the same manner as in the above (1), except that 10 parts of Permanent Yellow H10G was used as a yellow pigment in place of the cyan pigment and 1 part of 3,3'-carbonylbis(7-diethylaminocoumarin) (λmax=450 nm, manufactured by Kodak Co.) and 3 parts of ethyl N,N-dimethylbenzoate were used as photoinitiators.

(4) Each 30 g of the dispersions of photo-curable microcapsules containing cyan, magenta and yellow pigment obtained above were mixed with 50 g of wheat starch and 7 g of 20% aqueous polyvinyl alcohol solution to obtain a coating composition. This coating composition was coated on a polypropylene film of 60 μm thick by a wire coiled rod under red lamp light to obtain a photo-sensitive layer of about 15 μm thick.

(5) On the above photosensitive layer was coated a coating composition prepared by mixing 100 parts of a 30% titanium oxide (rutile type; refractive index: 2.70) dispersion with 36 parts of a 10% aqueous polyvinyl alcohol solution by a wire coiled rod to provide a whitening layer of about 2 μm thick. Furthermore, on the surface of this whitening layer was coated a coating composition prepared by mixing 100 parts of a 40% silica (refractive index: 1.436) dispersion with 80 parts of a 10% aqueous polyvinyl alcohol solution by a wire coiled rod to form an image receiving layer of about 6 μm thick (5.7 g/m$^2$). Thus, a color image recording material was obtained.

(6) A cyan print positive film obtained by three color separation of a color image was superposed on the side of polypropylene film of the resulting color image recording material and this was exposed to a monochromatic light of 330 nm using a diffraction spectral exposure device. Then, a magenta print positive film was superposed and exposed to a light of 380 nm and furthermore, a yellow print positive film was superposed and exposed to a light of 450 nm. This exposed color image recording material was passed between rolls under a linear pressure of 75 kg/cm at 80° C. to obtain clear color images on a white background.

EXAMPLE 2

A color image recording material was produced in the same manner as in Example 1 except that zinc oxide (refractive index: 2.01) was used in place of titanium oxide to provide a whitening layer of about 3 μm thick and kaolin (refractive index: 1.56) was used in place of silica to form an image receiving layer of about 9 μm thick in (5) of Example 1.

This color image recording material was exposed and developed in the same manner as in Example 1 to obtain clear color images on a white background.

EXAMPLE 3

A color image recording material was produced in the same manner as in Example 1 except that magnesium oxide (refractive index: 1.74) was used in place of titanium oxide to provide a whitening layer of about 4.5 μm thick and a pigment comprising a mixture (20 : 80) of polystyrene (refractive index: 1.59) and silica (refractive index: 1.436) was used in place of silica to form an image receiving layer of about 9 μm thick in (5) of Example 1.

This color image recording material was exposed and developed in the same manner as in Example 1 to obtain clear color images on a white background.

EXAMPLE 4

A 10% aqueous polyvinyl alcohol solution was coated on the white image receiving layer of the color image recording material made in Example 1 by a wire coiled rod to form an overcoat of about 4 μm thick.

This was exposed and developed in the same manner as in Example 1 to obtain photographic gloss color images on the white background.

COMPARATIVE EXAMPLE 1

On the surface of the photosensitive layer prepared in (4) of Example 1 was coated a coating composition prepared by mixing 100 parts of a 30% titanium oxide (anatase type; refractive index: 2.55) with 36 parts of a 10% aqueous polyvinyl alcohol solution by a wire coiled rod to produce a whitening layer of about 8 μm thick.

The resulting material was exposed and developed in the same manner as in Example 1. Color images were obtained on the white background, but density of the images was low and chroma was also low and thus the images lacked brightness and were inferior in image quality.

COMPARATIVE EXAMPLE 2

Color images were formed in the same manner as in Comparative Example 1 except that the thickness of about 8 μm of the whitening layer comprising titanium oxide was changed to about 2 μm. Image density was sufficient, but the background was greyish and chroma of the images was low. Thus, the images were inferior.

COMPARATIVE EXAMPLE 3

On the surface of the photosensitive layer formed in (4) of Example 1 was coated a coating composition prepared by mixing 100 parts of a 40% zinc oxide (refractive index: 2.01) with 48 parts of a 10% aqueous polyvinyl alcohol solution by a wire coiled rod to form a whitening layer of about 1 9 μm thick.

This was exposed and developed in the same manner as in Example 1. Although images were formed on the white background, density and chroma of the images were low and image quality was inferior and these were insufficient as color images.

COMPARATIVE EXMAPLE 4

On the surface of the photosensitive layer formed in (4) of Example 1 was coated a coating composition prepared by mixing 100 parts of a 40% silica (refractive index: 1.436) dispersion with 80 parts of a 10% aqueous polyvinyl alcohol solution by a wire coiled rod to form an image receiving layer of about 6 μm thick.

This was exposed and developed in the same manner as in Example 1 to obtain color images on a greyish background and these images were insuffficient as color images.

COMPARATIVE EXAMPLE 5

On the photosensitive layer formed in (4) of Example 1 was coated a coating composition prepared by mixing 100 parts of a 30% silica (refractive index: 1.436) dispersion with 54 g of a 10% aqueous polyvinyl alcohol solution by a wire coiled rod to provide a whitening layer of about 3 μm thick. On this whitening layer was further coated a coating composition prepared by mixing 100 parts of a 30% titanium oxide (refractive index: 2.55) dispersion with 54 g of a 10% aqueous polyvinyl alcohol solution by a wire coiled rod to provide an image receiving layer of about 7 μm thick. Thus, a color image recording material was obtained.

This was exposed and developed in the same manner as in Example 1 to obtain color images on the white background. However, density and chroma of the images were low to lack brightness. Thus, the images were insufficient as color images.

COMPARATIVE EXAMPLE 6

On the surface of the photosensitive layer prepared in (4) of Example 1 was coated a coating composition prepared by mixing 100 parts of a 30% titanium oxide (refractive index: 2.55) with 36 parts of a 10% aqueous polyvinyl alcohol solution by a wire coiled rod to provide a whitening layer of about 6 μm thick. Furthermore, on the surface of this whitening layer was coated a coating composition prepared by mixing 100 parts of a 30% silica (refractive index: 1.436) with 54 g of a 10% aqueous polyvinyl alcohol solution by a wire coiled rod to provide an image receiving layer of about 6 μm thick. Thus, a color image recording material was obtained.

The resulting color image recording material was exposed and developed in the same manner as in Example 1 to obtain only pale color images and they were not able to be called color images.

COMPARATIVE EXAMPLE 7

On the surface of the photosensitive layer prepared in (4) of Example 1 was coated a coating composition prepared by mixing 100 parts of a 30% titanium oxide (refractive index: 2.55) with 36 parts of a 10% aqueous polyvinyl alcohol solution by a wire coiled rod to provide a whitening layer of about 2 μm thick. Furthermore, on the surface of this whitening layer was coated a coating composition prepared by mixing 100 parts of a 30% silica (refractive index: 1.436) with 54 g of a 10% aqueous polyvinyl alcohol solution by a wire coiled rod to provide an image receiving layer of about 35 μm thick. Thus, a color image recording material was obtained.

The resulting color image recording material was exposed and developed in the same manner as in Example 1, but no images were formed on the white background.

As explained above, the color image recording material of the present invention can be easily produced by successively coating a photosensitive layer comprising photo-curable microcapsules containing a colored dye or pigment, a whitening layer and an image receiving layer on a transparent or translucent support. The resulting images are full color images superior in resolution and shelf stability. This color image recording material is industrially very valuable at the present time when color image recordings such as color reproduction and video printing are demanded.

What is claimed is:

1. A color image recording material which comprises a transparent or translucent support and, provided thereon, a photosensitive layer comprising three kinds of photo-curable microcapsules which contain any one of yellow, magenta or cyan dye or pigment and a photosensitive resin and which are sensitive to respectively different wavelengths and a whitening layer and an image receiving layer provided on the photosensitive layer in succession.

2. A color image recording material according to claim 1, wherein the whitening layer comprises pigment having a refractive index of 1.7 or higher.

3. A color image recording material according to claim 2, wherein the thickness of the whitening layer is 0.1–5 μm.

4. A color image recording material according to claim 3, wherein the thickness of the whitening layer is 0.5–3 μm.

5. A color image recording material according to claim 1, wherein the image receiving layer comprises a pigment having a refractive index of 1.4–1.6.

6. A color image recording material according to claim 1, wherein the thickness of the image receiving layer is 3–30 μm.

7. A color image recording material according to claim 6, wherein the thickness of the image receiving layer is 5–20 μm.

8. A color image recording material according to claim 1, 2 or 5, which additionally has a transparent film layer provided on the image receiving layer.

* * * * *